US012046486B2

United States Patent
Cai et al.

(10) Patent No.: US 12,046,486 B2
(45) Date of Patent: Jul. 23, 2024

(54) ETCHING TOOL FOR DEMOUNTABLY ETCHING MULTIPLE PIECES OF SILICON CARBIDE

(71) Applicant: Hunan Sanan Semiconductor Co., Ltd., Hunan (CN)

(72) Inventors: Shaozhong Cai, Hunan (CN); Jie Zhang, Hunan (CN); Huangshan Zhang, Hunan (CN); Yihong Lin, Hunan (CN); Sina Li, Hunan (CN)

(73) Assignee: Hunan Sanan Semiconductor Co., Ltd., Hunan (CN)

( * ) Notice: Subject to any disclaimer, the term of this patent is extended or adjusted under 35 U.S.C. 154(b) by 0 days.

(21) Appl. No.: 17/191,453

(22) Filed: Mar. 3, 2021

(65) Prior Publication Data

US 2021/0280439 A1    Sep. 9, 2021

(51) Int. Cl.
*H01L 21/67* (2006.01)
*H01L 29/16* (2006.01)

(52) U.S. Cl.
CPC .... *H01L 21/67086* (2013.01); *H01L 29/1608* (2013.01)

(58) Field of Classification Search
None
See application file for complete search history.

(56) References Cited

U.S. PATENT DOCUMENTS

| | | | | |
|---|---|---|---|---|
| 5,098,244 A | * | 3/1992 | Stimson | H01L 21/67775 414/744.3 |
| 5,402,807 A | * | 4/1995 | Moore | B08B 3/00 134/61 |
| 5,734,629 A | * | 3/1998 | Lee | G11B 19/12 |
| 8,702,142 B2 | * | 4/2014 | Kim | H01L 21/68707 414/941 |
| 9,257,319 B2 | | 2/2016 | Keigler | |
| 10,192,770 B2 | | 1/2019 | Yudovsky | |
| 10,431,435 B2 | | 10/2019 | Lubomirsky et al. | |
| 11,101,157 B2 | * | 8/2021 | Feng | H01L 21/67313 |
| 11,387,136 B2 | | 7/2022 | Konkola et al. | |

(Continued)

FOREIGN PATENT DOCUMENTS

| | | | | | |
|---|---|---|---|---|---|
| CN | 1676285 A | * | 10/2005 | | B25J 9/107 |
| CN | 109087856 A | * | 12/2018 | | H01L 21/308 |
| JP | 2018207022 A | * | 12/2018 | | H01L 21/67294 |

OTHER PUBLICATIONS

Machine Generated English Translation of the Bib Data of CN109087856. Published Dec. 25, 2018 (Year: 2018).*

(Continued)

*Primary Examiner* — Sylvia MacArthur

(57) ABSTRACT

A detachable etching tool for etching a plurality of silicon carbide pieces has a first supporting column and a second supporting column, both of which are fixed through a tool fixing block. A bracket is arranged on the tool fixing block, and a limiting rod is installed on the lower end surface of the bracket. The bracket is inserted into the tool fixing block through the limiting rod and fixed on the tool fixing block with a fastening mechanism that comprises a base, a fixing seat, a telescopic spring, a telescopic guide column, a sliding block, a guide block, an inserting rod and a push-pull mechanism. The etching tool addresses low productivity per unit time and long time consumption in the etching processing.

16 Claims, 6 Drawing Sheets

(56) References Cited

U.S. PATENT DOCUMENTS

| | | | | |
|---|---|---|---|---|
| 2002/0139481 A1* | 10/2002 | Baxter | ................... | G03F 7/203 |
| | | | | 118/728 |
| 2003/0132176 A1* | 7/2003 | Takano | .............. | H01L 21/6734 |
| | | | | 211/41.1 |
| 2021/0280439 A1* | 9/2021 | Cai | .................. | H01L 21/67306 |

OTHER PUBLICATIONS

Machine Generated English Translation of the Specification of CN109087856. Published Dec. 25, 2018 (Year: 2018).*

* cited by examiner

ETCHING TOOL FOR DEMOUNTABLY ETCHING MULTIPLE PIECES OF SILICON CARBIDE

CROSS-REFERENCE TO RELATED APPLICATIONS

This application claims priority to Chinese Utility Patent Application No. 202020257384.6U entitled "ETCH TOOL FOR DEMOUNTABLY ETCHING MULTIPLE PIECE OF SILICON CARBIDE" filed before China's National Intellectual Property Administration on Mar. 5, 2020, the entire contents of each of which are incorporated herein by reference.

STATEMENT RE: FEDERALLY SPONSORED RESEARCH/DEVELOPMENT

Not Applicable

BACKGROUND

1. Technical Field

The present disclosure relates generally to the technical field of semiconductor fabrication and tools therefor, and specifically etching processing of semiconductor single crystal wafer materials. The disclosure also relates to an etching tool for detachably etching a plurality of silicon carbide pieces.

2. Related Art

Silicon carbide is an important third-generation semiconductor material developed after the first-generation semiconductor Si and the second-generation semiconductor GaAs. It has the advantages of wide band gap, high thermal conductivity, high breakdown field strength, high carrier saturation, high radiation resistance and good chemical stability. Because of its own characteristics, the application of the third-generation semiconductor technology will promote the potential market in the three major fields of energy conservation and emission reduction, information technology and national defense science and technology. In recent years, it has rapidly penetrated into every corner of lighting, electronic power devices, microwave radio frequency and other fields, and its market scale has been rapidly improved. It has a wide application market in the fields of new energy vehicles, automobile lighting, general lighting, electric vehicles, and 5G communication applications, and will become one of the directions of new energy development in the future.

As the substrate material of epitaxial chip, silicon carbide material has a strong demand for its crystal quality. Through etching, the crystal defects of SiC wafer (substrate and seed crystal) can appear after etching. The main way to judge the crystal quality can be effectively through the reflected characterization.

The existing etching process of SiC wafer (substrate and seed crystal) mainly adopts single wafer etching, which involves placing the wafer on a fixed bracket (each jig has only one bracket). When the etching solution reaches the predetermined etching temperature, the bracket with SIC wafer is placed into the chemical solution, so that the chemical solution does not pass through the wafer completely and the wafer completely contacts and reacts. After the process time of about 10 minutes, the jig is completely lifted out. The jig may be maintained at room temperature for cooling purposes, the wafer is cleaned after cooling, and then examined under a metallographic microscope to observe the defect quality of the wafer. Because the etching unit time is long and the number of wafers cannot be flexibly applied, it causes the phenomena of low etching efficiency, low unit productivity and inflexible etching quantity in the prior art, which has a great influence on the connection of production and the establishment of production schedule.

SUMMARY

The present disclosure aims to provide a detachable etching tool for etching multiple pieces of silicon carbide, which solves the problems of low productivity per unit time and long time consumption in etching processing, can flexibly etch the number and shorten the processing time as much as possible, and can solve the problems in the prior art.

In order to achieve this purpose, one embodiment of the present disclosure provides the following technical features: a detachable etching tool for etching multiple pieces of silicon carbide comprises a supporting column A and a supporting column B which are arranged in parallel, wherein the supporting column A and the supporting column B are connected and fixed by a tool fixing block, and a bracket is arranged on the tool fixing block, and a limiting rod is installed on the lower end surface of the bracket, and the bracket is inserted into the tool fixing block through the limiting rod and fixed on the tool fixing block by a fastening mechanism.

The fastening mechanism comprises a base, a fixing seat, a telescopic spring, a telescopic guide post, a slider, a guide block, an insertion rod and a push-pull handle, wherein the base is installed on the fixture block; the inner wall of the base is provided with a fixing seat which is connected with a slider through the telescopic spring and the telescopic guide post.

Preferably, the bracket has an arc structure, and both ends of the bracket are provided with positioning baffles.

Preferably, the upper ends of the support column a and the support column b are both provided with jig hooks.

Preferably, a wafer is placed on the bracket.

Preferably, the tooling fixing block is provided with an installation groove for inserting and matching the limiting rod, and the limiting rod is provided with a clamping groove for inserting and matching the inserting rod.

Preferably, the fixture fixing block is provided with a slot for inserting the insertion rod and matching with the insertion rod.

Compared with the prior art, the embodiments of the present disclosure contemplate the following beneficial effects: When the traditional etching tool etches 100 wafers, the productivity per unit time is 6 pcs/H, which takes 16.66H, while when the new detachable etching tool etches 100 wafers, the productivity per unit time is 24 pcs/H, which takes 4.166H. The new etching fixture for demountable etching of multiple pieces of silicon carbide can solve the problems of low productivity per unit time and long time consumption in etching processing, which can flexibly etch the number and shorten the processing time as much as possible. Compared with the traditional etching fixture, the processing time is shortened by 4 times. In addition, under the condition of changing the size of etching crucible, the wafer carrier can be expanded, which is of great help to the improvement of productivity and the needs of personnel.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
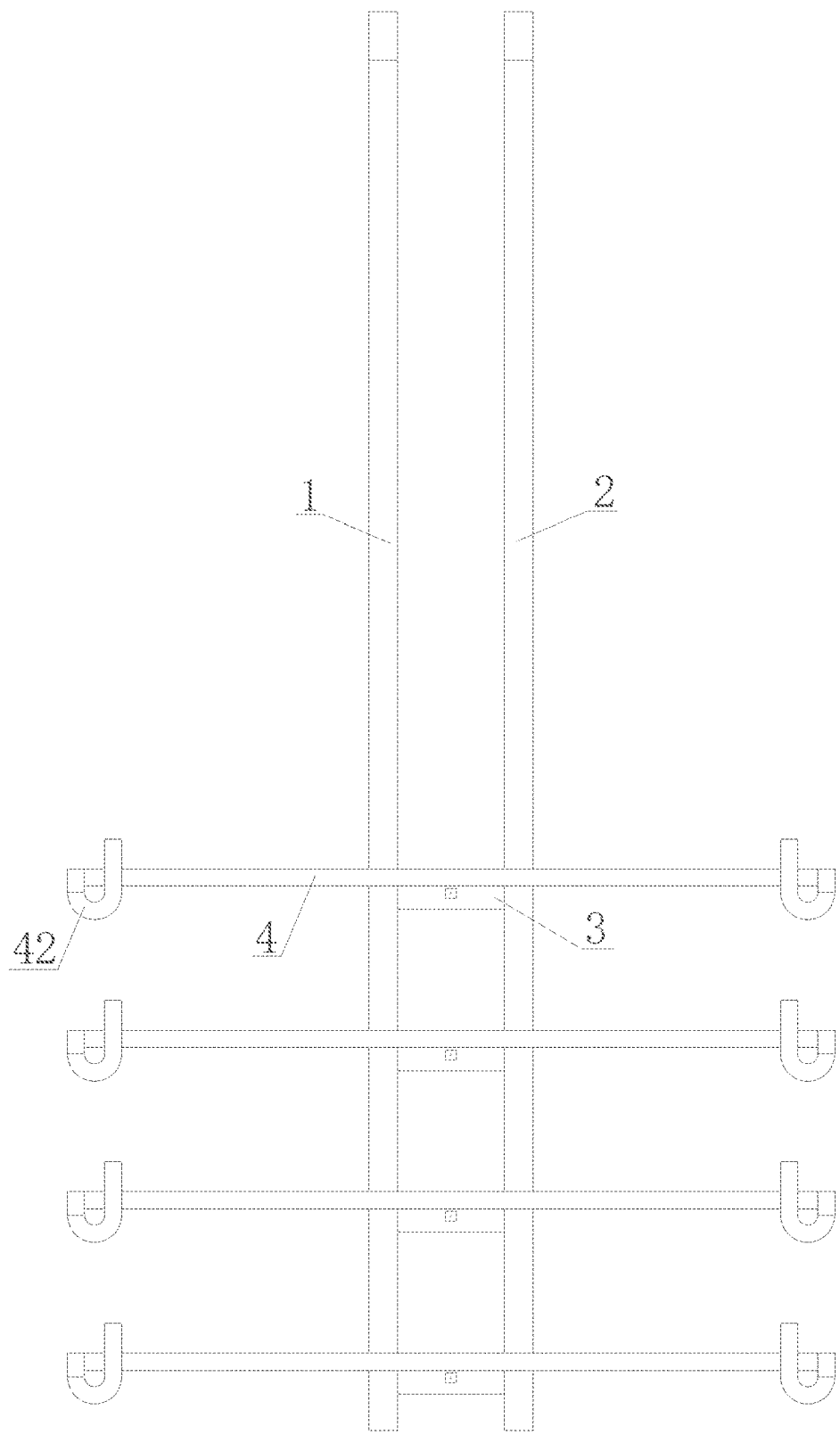
FIG. 1 is a front view of a detachable etching tool for etching a plurality of silicon carbide pieces in accordance with an embodiment of the present disclosure.
Figure 2:
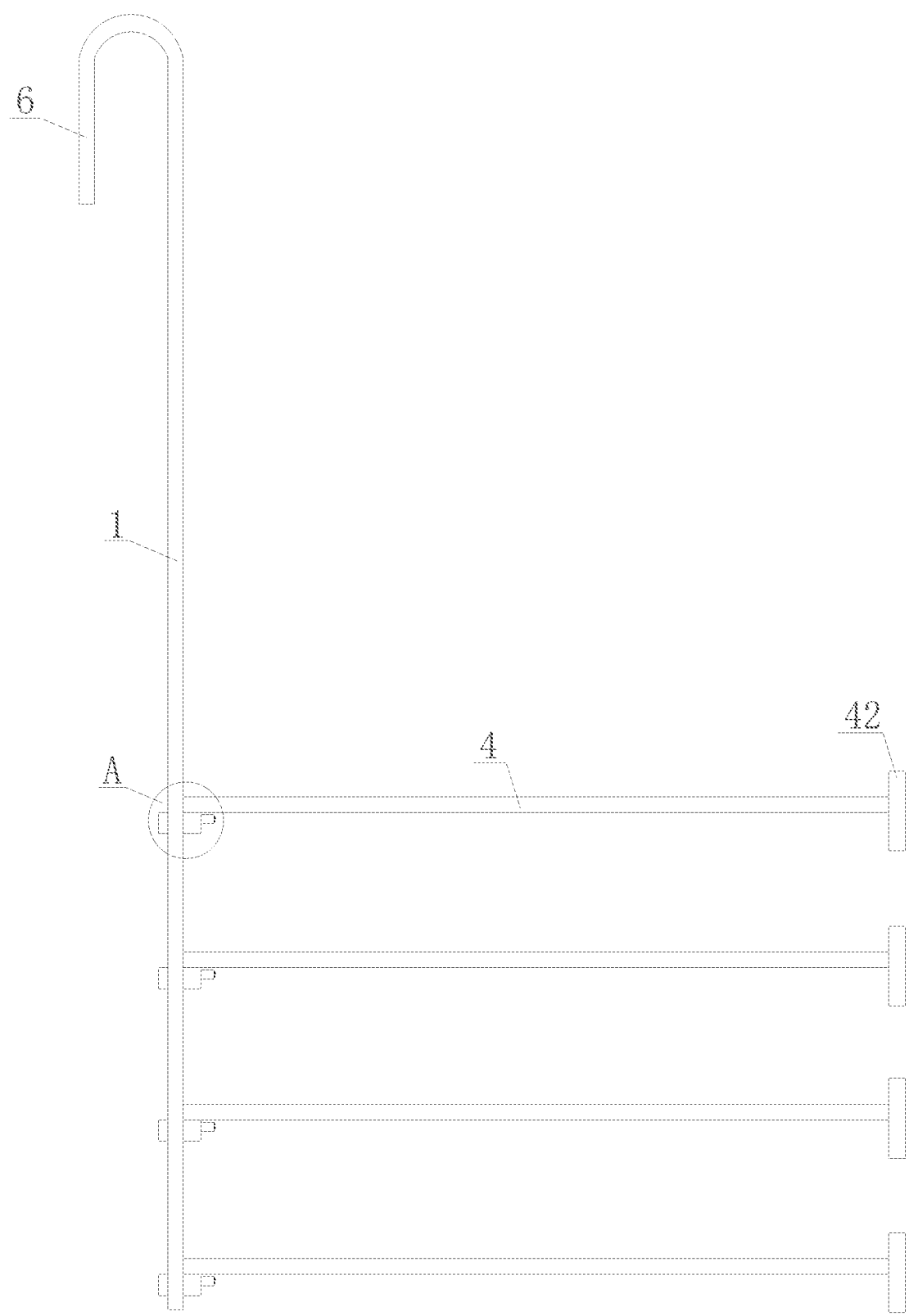
FIG. 2 is a side view of the detachable etching tool for etching a plurality of silicon carbide pieces in accordance with an embodiment of the present disclosure.
Figure 3:
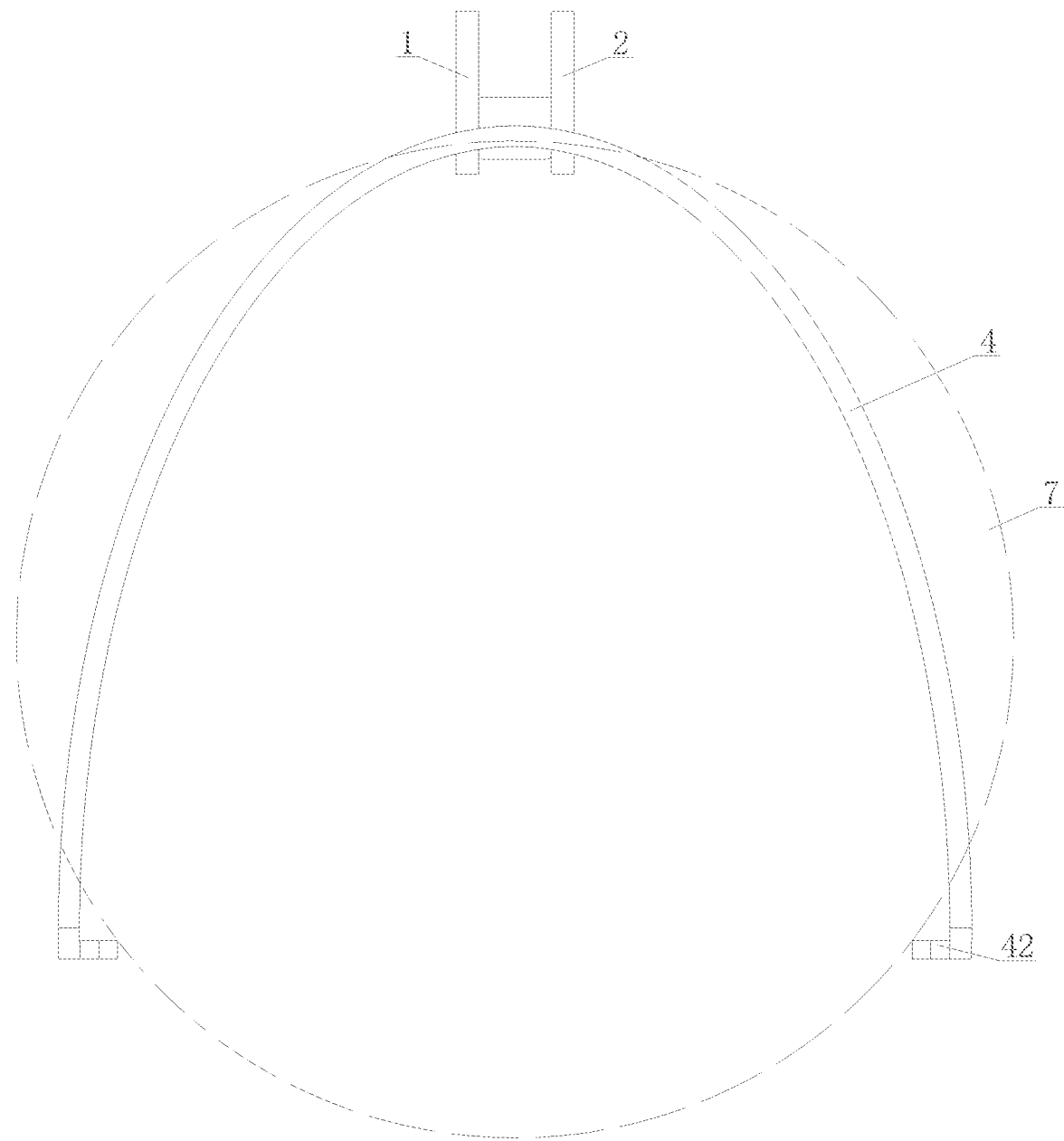
FIG. 3 is a top view of the detachable etching tool for etching a plurality of silicon carbide pieces in accordance with an embodiment of the present disclosure.
Figure 4:
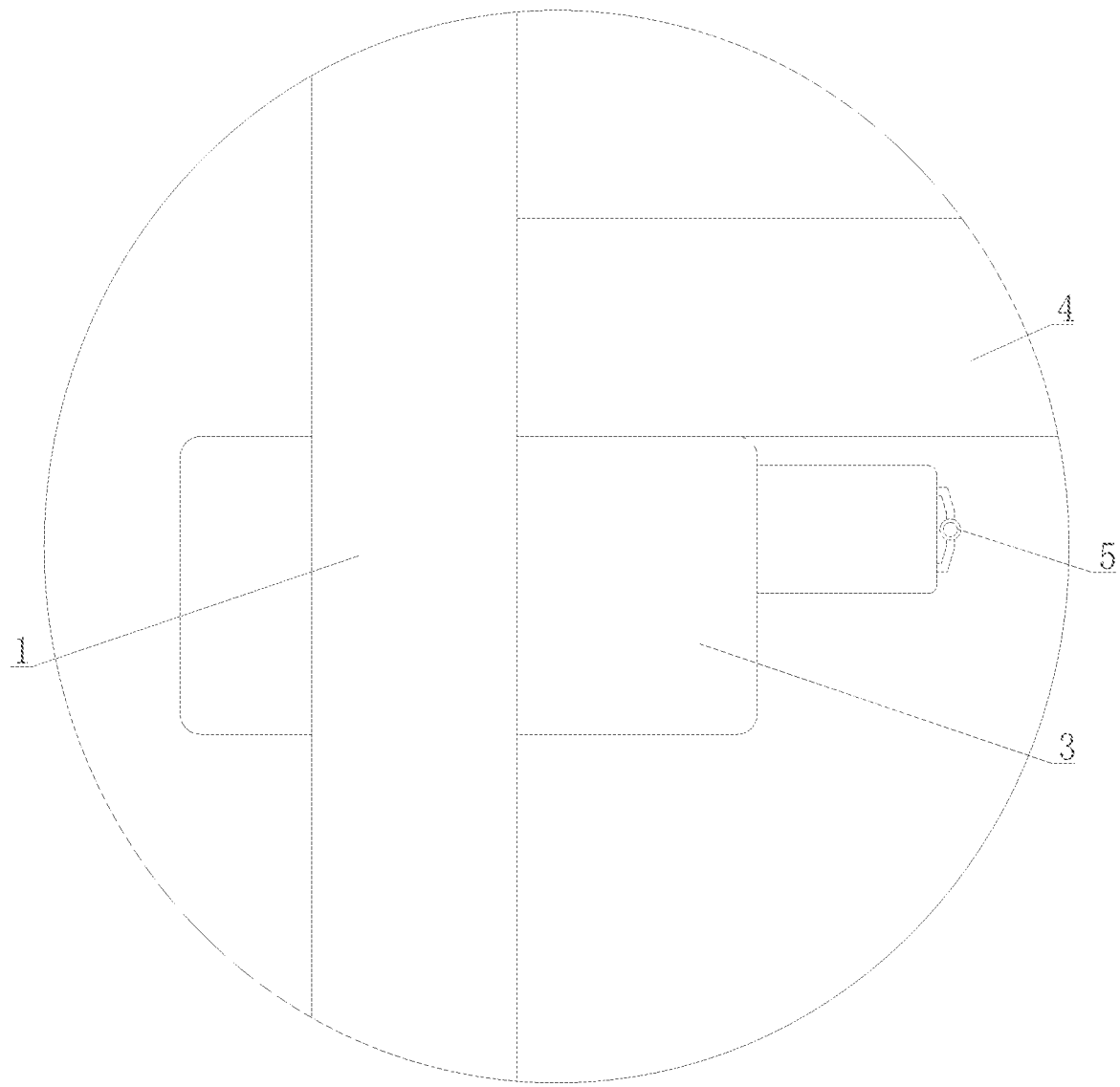
FIG. 4 is an enlarged view of a positioning baffle of the detachable etching tool in accordance with an embodiment of the present disclosure.

In the following, the technical scheme in the embodiment of the present disclosure will be described clearly and completely with reference to the drawings. It will be appreciated that the described embodiments are merely exemplary. Based on these embodiments, all other embodiments within the purview of those having ordinary skill in the art are deemed to be within the scope of the present disclosure.

In the figures: 1. Support column A; 2. Support column b; 3. Fixing block of tooling; 31. Installation slot; 32. Slot; 4. Bracket; 41. Limit lever; 411. Card slot; 42. Positioning baffle; 5. Fastening mechanism; 51. Pedestal; 52. Fixed seat; 53. Telescopic spring; 54. Telescopic guide column; 55. Sliding block; 56. Guide block; 57. Insert rod; 58. Push and pull the handle; 6. Jig hook; 7. Wafer.

With reference to FIG. 1-4, an etching tool for demountably etching a plurality of silicon carbide pieces comprises support columns A1 and B2 which are arranged in parallel, and the upper ends of the support columns A1 and B2 are both provided with tool hooks 6, so that the fixture can be conveniently fixed by adding the tool hooks 6, and brackets 4 are added and installed according to the number of wafers 7 to be etched, thereby solving the problems that the number of SIC wafers 7 etched simultaneously is small and the etching efficiency is low due to single etching of wafers 7. The support column A1 and the support column B2 are connected and fixed by a fixture block 3, which is provided with a bracket 4 on which wafers 7 are placed. The bracket 4 made of nickel supports the wafers 7, and the lower end face of the bracket 4 is provided with a limiting rod 41. The bracket 4 is inserted into the fixture block 3 through the limiting rod 41 and fixed on the fixture block 3 by a fastening mechanism 5, so that the bracket 4 is convenient to install or disassemble. The number of etched wafers 7 can be flexibly changed, and the productivity can be improved several times. The multi-layer design can be in the horizontal or vertical direction. The detachable bracket 4 can be in regular or irregular shape. The bracket 4 has an arc structure, and both ends of the bracket 4 are provided with positioning baffles 42.

Figure 5:
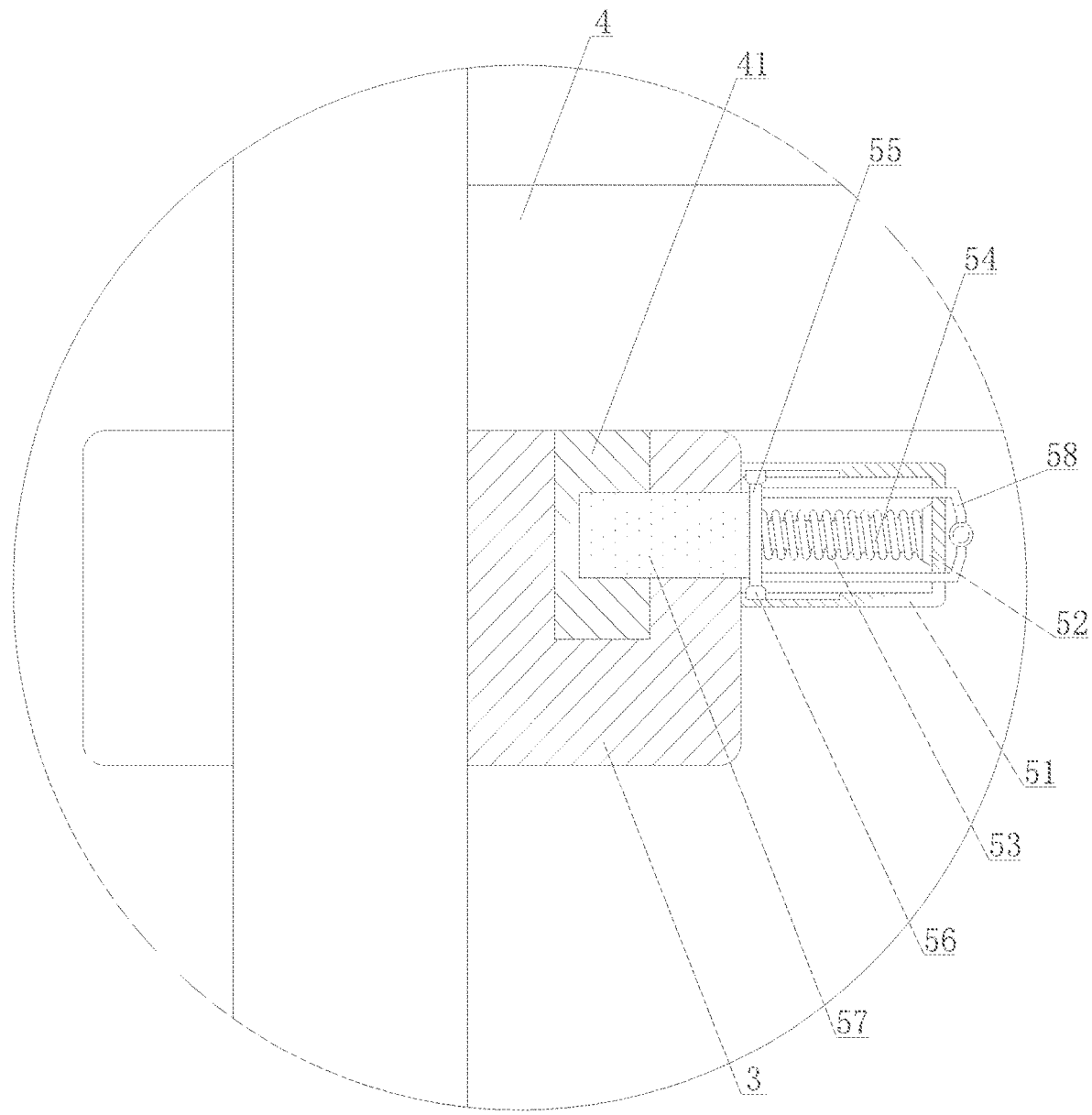
FIG. 5 is a sectional view of FIG. 4.
Figure 6:
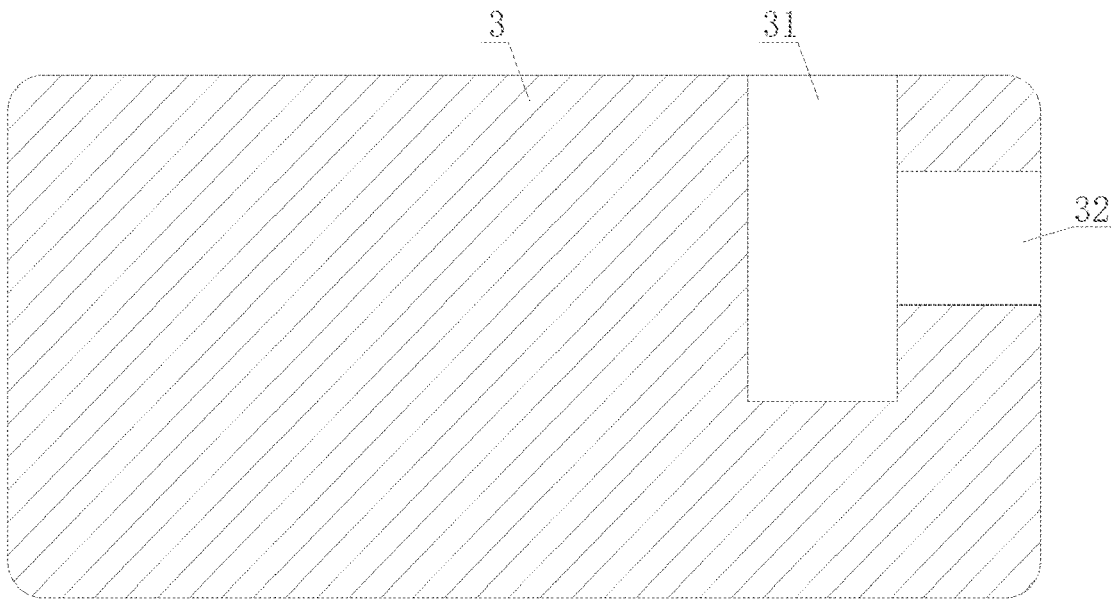
FIG. 6 is a sectional view of the fixture block in accordance with an embodiment of the present disclosure.
Figure 7:
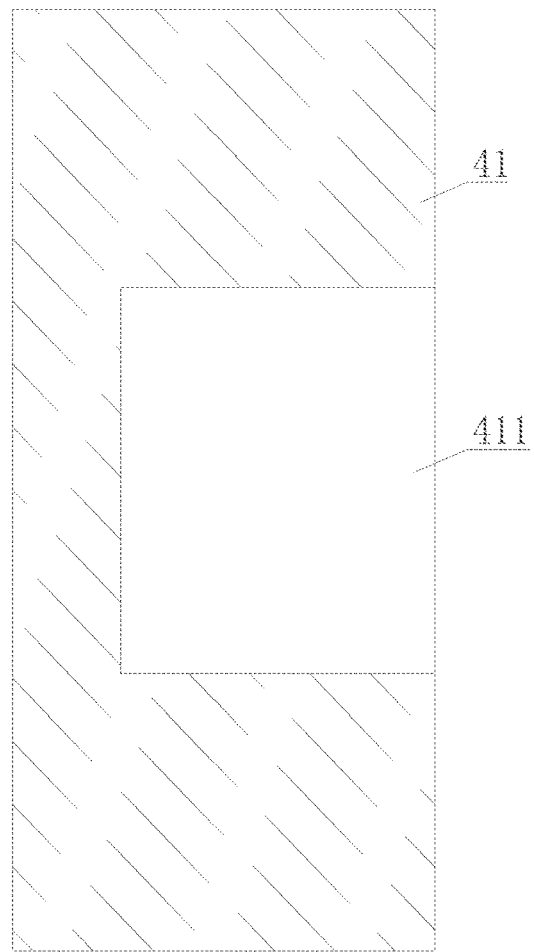
FIG. 7 is a sectional view of the limiting rod of the detachable etching tool in accordance with an embodiment of the present disclosure.

Referring to FIGS. 5-7, the fastening mechanism 5 includes a base 51, a fixing seat 52, a telescopic spring 53, a telescopic guide post 54, a sliding block 55, a guide block 56, a plug 57 and a push-pull handle 58. The base 51 is installed on the fixture block 3, and the inner wall of the base 51 is provided with a fixing seat 52 connected with a sliding block 55 through the telescopic spring 53 and the telescopic guide post 54, and the sliding block 55 is installed through the guide block 56 The sliding block 55 is provided with an insertion rod 57, which is inserted into the fixture block 3 and extends into the limit rod 41. The fixture block 3 is provided with an installation groove 31 for inserting and matching the limit rod 41. The limit rod 41 is provided with a clamping groove 411 for inserting and matching the insertion rod 57. The fixture block 3 is provided with a slot 32 for inserting and matching the insertion rod 57. The sliding block 55 is also provided with a push-pull handle 52.

Installation process of bracket 4: The slider 55 is driven by the push-pull handle 58 to move horizontally under the guidance of the guide block 56, so that the insertion rod 57 also moves synchronously. At this time, both the telescopic spring 53 and the telescopic guide post 54 contract until the insertion rod 57 leaves the installation slot 31. At this time, the bracket 4 is installed on the fixture block 3 through the limit lever 41, and the push-pull handle 58 is released. Since the telescopic spring 53 and the telescopic guide post 54 are no longer squeezed, and due to the self-restoring action of the telescopic spring 53, both the telescopic spring 53 and the telescopic guide post 54 are extended, and then the insertion rod 57 is pushed into the fixture block 3 to extend into the limiting rod 41. At this time, the bracket 4 is inserted into the fixture block 3 through the limiting rod 41 and fixed on the fixture block 3 by the fastening mechanism 5.

Dismantling process of bracket 4: Push and pull the handle 58 to drive the sliding block 55 to move horizontally under the guidance of the guide block 56, and then make the insertion rod 57 move synchronously until the insertion rod 57 leaves the limit rod 41. Since the limit rod 41 is no longer fixed by the insertion rod 57, the bracket 4 can be disassembled from the fixture block 3.

Technical Steps:
1. Confirm the number of wafers 7 to be etched, and disassemble or install the bracket 4;
2. After the bracket 4 is installed, place the wafer 7 on the bracket 4;
3. Put the placed wafer 7 and jig into the etching solution;
4. The etching solution should completely pass through the wafer 7, so that the wafer 7 can completely contact with the solution for reaction;
5. Place the jig hook 6 on the crucible lug;
6. After the etching time and process is completed and the fixture is cooled, the bracket 4 is removed and the wafer 7 is cleaned.

To sum up, when the traditional etching tools and fixtures etch 100 wafers 7, the unit time production capacity is 6 pcs/h, and the time consumption is 16.66 h. When using the new removable etching multi silicon carbide etching tooling and fixture to etch 100 chips 7, the unit time production capacity is 24 pcs/h, and the time consumption is 4.166 h. A new type of removable etching fixture for etching multiple silicon carbide is used to solve the problems of low productivity and long time consumption per unit time in etching process. It can flexibly etch the quantity and shorten the processing time as far as possible. Compared with the traditional etching processing fixture, the processing time is shortened by 4 times. In addition, the bracket 4 used to support the wafer 7 can be expanded under the condition of changing the size of the etching crucible, Thus, it is of great help to the improvement of production capacity and the demand of personnel.

It should be noted that in this disclosure, relational terms such as first and second are only used to distinguish one entity or operation from another, and do not necessarily require or imply any such actual relationship or order between these entities or operations. Moreover, the terms "include," "include," or any other variation thereof are intended to cover non-exclusive inclusion so that a process, method, article, or device that includes a series of elements includes not only those elements, but also other elements not explicitly listed, or those inherent to such process, method, article or device. Although the embodiments of the present disclosure have been shown and described, it can be understood by ordinary technical personnel in the art that a variety of changes, modifications, substitutions and modifications can be made to these embodiments without departing from the principle and spirit thereof.

What is claimed is:

1. A detachable etching tool for etching a plurality of silicon carbide wafers, comprising:
    a first support column;
    a second support column arranged in parallel with the first support column,
    a plurality of tool fixing blocks connecting the first support column and the second support column at fixed positions along the first and second support columns; and
    a plurality of brackets on which given ones of the silicon carbide wafers are placed and each being removably attachable to a corresponding one of the tool fixing blocks and arranged on the side of the first and second support columns;
    a plurality of fastening mechanisms each coupling of a given one the plurality of brackets to a corresponding one of the tool fixing blocks, each one of the fastening mechanisms including an insertion rod of a sliding block insertable into a base of a the corresponding one of the tool fixing blocks, the sliding block being connected to a fixing seat through a telescopic spring and a telescopic guidepost and movable along a guide block.

2. The detachable etching tool of claim 1, wherein the fastening mechanisms each further includes a plug rod, and a push handle.

3. The detachable etching tool of claim 1, wherein at least one of the brackets has an arcuate structure, with both ends thereof being provided with positioning baffles.

4. The detachable etching tool of claim 1, wherein upper ends of the first support column and the second support column both include tool hooks.

5. The detachable etching tool of claim 1, wherein a wafer is positionable on a given one of the brackets.

6. The detachable etching tool of claim 1, wherein each of the tool fixing blocks defines an installation groove for inserting and matching a limiting rod, the limiting rod including a clamping groove for inserting and matching the insertion rod.

7. The detachable etching tool of claim 1, wherein each of the tool fixing blocks defines a slot for inserting the insertion rod and matching with the insertion rod.

8. The detachable etching tool of claim 6, wherein the installation groove is vertically oriented to receive the limiting rod, the limiting rod being attached to the bracket.

9. The detachable etching tool of claim 7, wherein the slot defined by the tool fixing block is horizontally oriented to receive the insertion rod.

10. The detachable etching tool of claim 7, wherein the slot opens to the base of a given one of the fastening mechanisms.

11. The detachable etching tool of claim 7, wherein each of the tool fixing blocks defines an installation groove for inserting and matching a limiting rod, the limiting rod including a clamping groove alignable with the slot defined by a given one of the tool fixing blocks, the insertion rod being insertable through both the clamping groove and the slot to lock the limiting rod and the bracket to the given one of the tool fixing blocks.

12. The detachable etching tool of claim 1, wherein one end of the telescopic guidepost includes a fixing seat abutting against an interior wall of the base.

13. The detachable etching tool of claim 12, wherein another end of the telescoping guidepost abuts against the insertion rod.

14. The detachable etching tool of claim 13, wherein the telescopic spring is positioned on the telescopic guidepost between the two ends thereof, applying biasing force against both the insertion rod and the interior wall of the base.

15. The detachable etching tool of claim 1, wherein the guide block defines at least one interior groove proximal to the tool fixing block along which the sliding block is movable.

16. The detachable etching tool of claim 15, wherein the sliding block is receivable within the at least one interior groove.

* * * * *